United States Patent [19]
Takai et al.

[11] Patent Number: 6,163,190
[45] Date of Patent: Dec. 19, 2000

[54] HYSTERESIS COMPARATOR CIRCUIT CONSUMING A SMALL CURRENT

[75] Inventors: Masami Takai, Tokyo; Yasuhiro Sugimoto, Kanagawa, both of Japan

[73] Assignees: Ricoh Company, Ltd.; Yasuhiro Sugimoto, both of Tokyo, Japan

[21] Appl. No.: 09/342,163

[22] Filed: Jun. 16, 1999

[30] Foreign Application Priority Data

Jun. 22, 1998 [JP] Japan ..................... 10-174768

[51] Int. Cl.[7] ..................................................... H03K 5/24
[52] U.S. Cl. ............................. 327/205; 327/131; 327/73
[58] Field of Search .................................. 327/50, 72, 73, 327/205, 131

[56] References Cited

U.S. PATENT DOCUMENTS 4,602,169   7/1986   Shimuzu ............................... 327/205
5,463,333  10/1995   Calder et al. ........................ 327/205

FOREIGN PATENT DOCUMENTS 6-86083  12/1994   Japan .

*Primary Examiner*—Dinh T. Le
*Attorney, Agent, or Firm*—Cooper & Dunham LLP

[57] ABSTRACT

A hysteresis comparator circuit and a waveform generating circuit reduce a power consumption of a DC/DC converter so as to improve a power consumption efficiency when the DC/DC converter is operated with a relatively small load. The hysteresis comparator circuit is connected to a reference voltage source providing a reference voltage. A hysteresis comparator compares an input voltage with one of a first threshold voltage and a second threshold voltage. A hysteresis voltage generating circuit selectively generates one of the first and second threshold voltages by controlling a state of electric charge stored in each of the capacitors. An electric charge stored in the capacitors is provided from the reference voltage source.

11 Claims, 6 Drawing Sheets

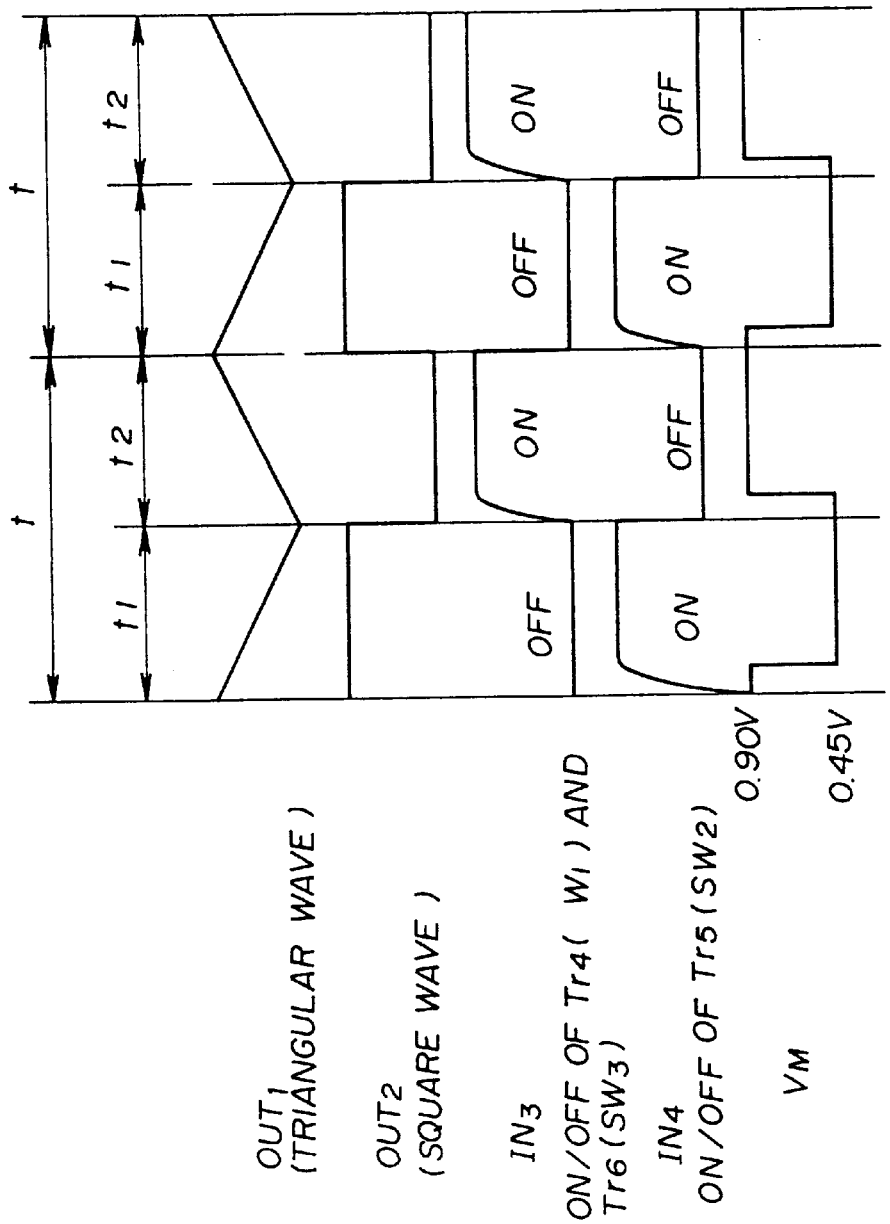

6,163,190

HYSTERESIS COMPARATOR CIRCUIT CONSUMING A SMALL CURRENT

BACKGROUND OF THE INVENTION

1. Field of the Invention

The present invention generally relates to a hysteresis comparator circuit and, more particularly, to a hysteresis comparator circuit suitable for generating a triangle waveform signal used for a DC/DC converter by using a pulse width modulation (PWM) method and a waveform generating circuit using such a hysteresis comparator circuit.

2. Description of the Related Art

Japanese Laid-Open Utility Model Application No. 6-86083 discloses a conventional hysteresis comparator circuit which includes a hysteresis comparator having a first input terminal to which an input voltage signal is input and a second input terminal to which a first threshold voltage or a second threshold voltage smaller than the first threshold voltage is selectively input. The second input voltage is input to the second input terminal via a switching element when an output voltage of the comparator is at a predetermined level. The hysteresis comparator circuit has a circuit structure in which the second threshold voltage is given priority over the first threshold voltage to be input to the second input terminal.

FIG. 1 shows a circuit diagram of a conventional waveform generating circuit having the above-mentioned hysteresis comparator circuit. The hysteresis comparator circuit 10A shown in FIG. 1 provides a hysteresis characteristic to a reference voltage $V_M$ of a comparator CMP by changing a ratio of resistances $R_1:R_2:R_3$ of the resistive elements $R_1$, $R_2$ and $R_3$.

For example, if the ratio of resistances $R_1:R_2:R_3$ is set to 3:1:2 and the reference voltage source $V_{ref}$ is set to 1.8 $V_{dc}$, a current $I_1$ flowing from the reference voltage source $V_{ref}$ is represented by the following equation.

$$I_1 = V_{ref} \times t_1 / \{(R_1+R_2+R_3) \times t\} + V_{ref} \times t_2 / \{(R_1+R_2) \times t\}$$

where $t_1$ is a period during which a transistor $Tr_1$ shown in FIG. 1 is turned off; $t_2$ is a period during which the transistor $Tr_1$ is turned on; and t is a sum of the period $t_1$ and the period $t_2$ ($t=t_1+t_2$).

Accordingly, when the transistor $Tr_1$ is turned off, the reference voltage $V_M$ of the comparator CMP is represented as follows.

$$V_M = V_{ref} \times (R_2+R_3)/(R_1+R_2+R_3) = 1.8 \times 3/6 = 0.9 \ V$$

On the other hand, when the transistor $Tr_1$ is turned on, the reference voltage $V_M$ of the comparator CMP is represented as follows.

$$V_M = V_{ref} \times R_2/(R_1+R_2) = 1.8 \times 1/4 = 0.45 \ V$$

Accordingly, in this case, the hysteresis provided to the reference voltage $V_M$ is 0.45 (=0.9–0.45) V.

The above-mentioned conventional hysteresis comparator circuit 10A is combined with a constant current charging and discharging circuit 20A so as to form a waveform generating circuit. As shown in FIG. 1, the constant current charging and discharging circuit 20A comprises transistors $Tr_2$ and $Tr_3$ and a capacitor $C_1$. An integrating circuit (not shown in the figure) may be substituted for the constant current charging and discharging circuit 20A.

In the above-mentioned conventional hysteresis comparator circuit 10A, the sum of the resistances of the resistive elements $R_1$, $R_2$ and $R_3$ is set to about 1 MΩ. Accordingly, there is a problem in that the current $I_1$ continues to flow through the resistive elements $R_1$, $R_2$ and $R_3$.

In order to reduce the current $I_1$ flowing through the resistive elements $R_1$, $R_2$ and $R_3$, the resistances of the resistive elements $R_1$, $R_2$ and $R_3$ must be set to large values. However, if the resistances of the resistive elements $R_1$, $R_2$ and $R_3$ are increased, an impedance of the resistive circuit comprising the resistive elements $R_1$, $R_2$ and $R_3$ is also increased. As a result, there is a problem in that the circuit is unstable with respect to a sharp voltage fluctuation of the power source.

The above-mentioned waveform generating circuit provided with the hysteresis comparator circuit 10A or a DC/DC converter provided with the waveform generating circuit is used for converting a level of a DC voltage. The conversion of the level of the DC voltage may include a voltage increasing conversion, a voltage decreasing conversion and a polarity reversing conversion. In such a conversion, a power conversion efficiency is an important factor. Especially, in a case in which a CPU is connected to a DC/DC converter and when the CPU is set in a sleep mode, the power conversion efficiency of the DC/DC converter is greatly influenced by the power consumed by the DC/DC converter itself. Thus, in such a case, there is a problem in that the power conversion efficiency is decreased.

SUMMARY OF THE INVENTION

It is a general object of the present invention to provide an improved and useful hysteresis comparator circuit in which the above-mentioned problems are eliminated.

A more specific object of the present invention is to provide a hysteresis comparator circuit and a waveform generating circuit which can reduce a power consumption of a DC/DC converter so as to improve a power consumption efficiency when the DC/DC converter is operated with a relatively small load.

In order to achieve the above-mentioned objects, there is provided according to the present invention a hysteresis comparator circuit adapted to be connected to a reference voltage source providing a reference voltage, the hysteresis comparator circuit comprising:

a hysteresis comparator comparing an input voltage with one of a first threshold voltage and a second threshold voltage different from the first threshold voltage; and a hysteresis voltage generating circuit comprising a plurality of capacitors so as to selectively generate one of the first threshold voltage and the second threshold voltage by controlling a state of electric charge stored in each of the capacitors, the electric charge stored in the capacitors being provided from the reference voltage source.

According to the above-mentioned invention, the first and second threshold voltages which provide a hysteresis characteristic can be generated by the plurality of capacitors without using a plurality of resistors as in the conventional circuit. Thus, an electric power consumed by the hysteresis comparator circuit is only a current to charge the capacitors. Thus, the electric power consumed by the hysteresis comparator circuit according to the present invention can be smaller than an electric power consumed by the conventional hysteresis comparator circuit using a plurality of resistive elements in which a current continuously flows through the resistive elements.

Accordingly, by applying the above-mentioned hysteresis comparator circuit to a waveform generating circuit of a DC/DC converter, a conversion efficiency of the DC/DC converter can be improved when the DC/DC converter is operated with a small load.

In the hysteresis comparator circuit according to the present invention, the hysteresis voltage generating circuit may further include a plurality of switching elements so as to control a connection between the capacitors and the reference voltage source. Additionally, the hysteresis comparator circuit may further comprise a switch drive circuit providing switching signals to the switching elements so as to control an operation of each of the switching elements.

Additionally, the switch drive circuit may generate the switching signals so that a timing of change of state of one of the switching elements is shifted from that of the rest of the switching elements. According to this invention, the switching elements are not turned on at the same time, and, thereby, the reference voltage provided to the comparator is prevented from being undesirably dropped.

Additionally, there is provided according to another aspect of the present invention a waveform generating circuit comprising the above-mentioned hysteresis comparator circuit and a constant current charging and discharging circuit. The waveform generating circuit outputs a triangular wave signal corresponding to an output signal of the hysteresis comparator circuit.

Other objects, features and advantages of the present invention will become more apparent from the following detailed description when read in conjunction with the accompanying drawings.

BRIEF DESCRIPTION OF THE DRAWINGS

FIG. 3 is a timing chart of the waveform generating circuit shown in FIG. 2;

DETAILED DESCRIPTION OF THE PREFERRED EMBODIMENTS

Figure 1:
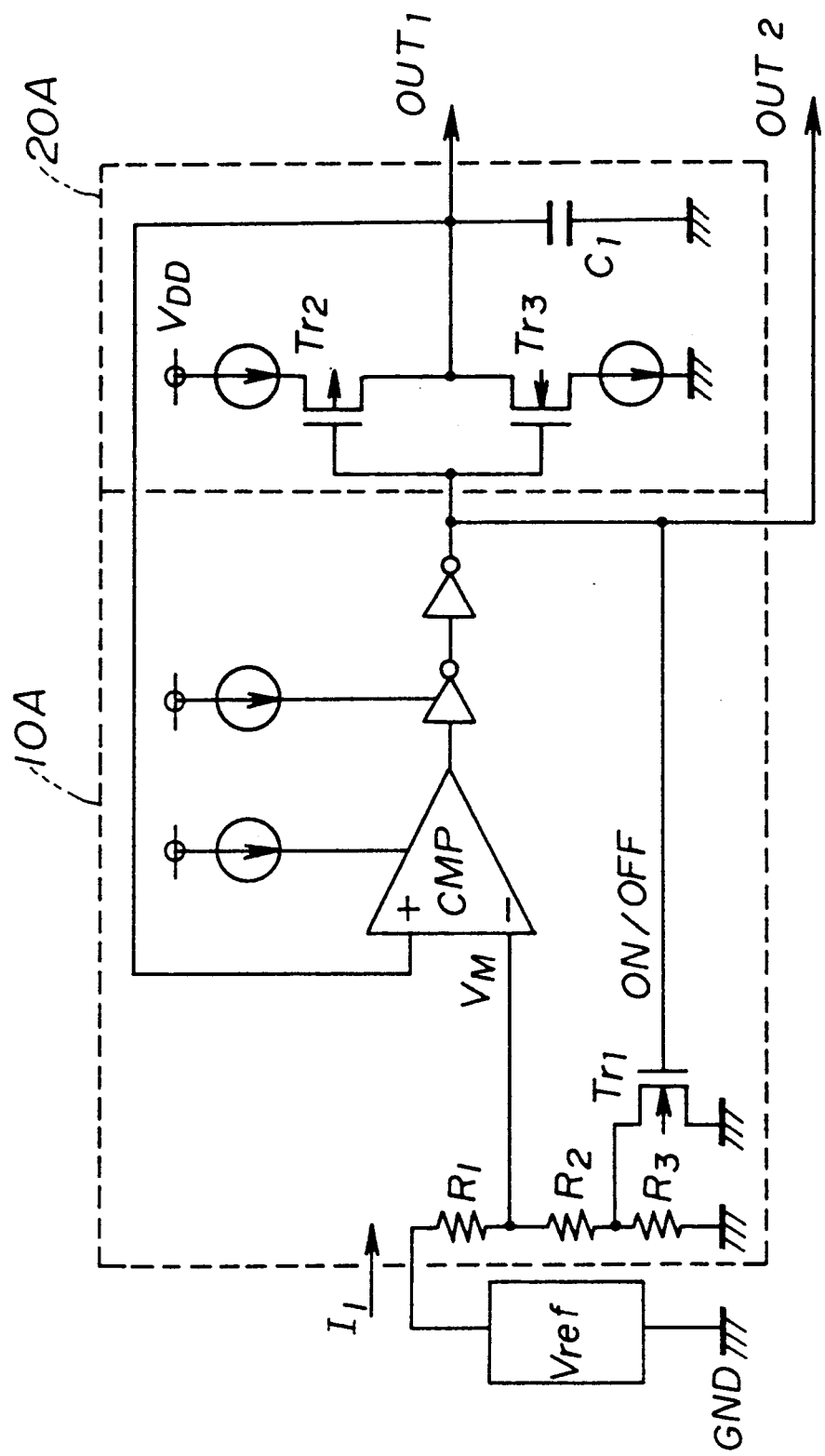
FIG. 1 is a circuit diagram of a conventional waveform generating circuit having a comparator circuit.
Figure 2:
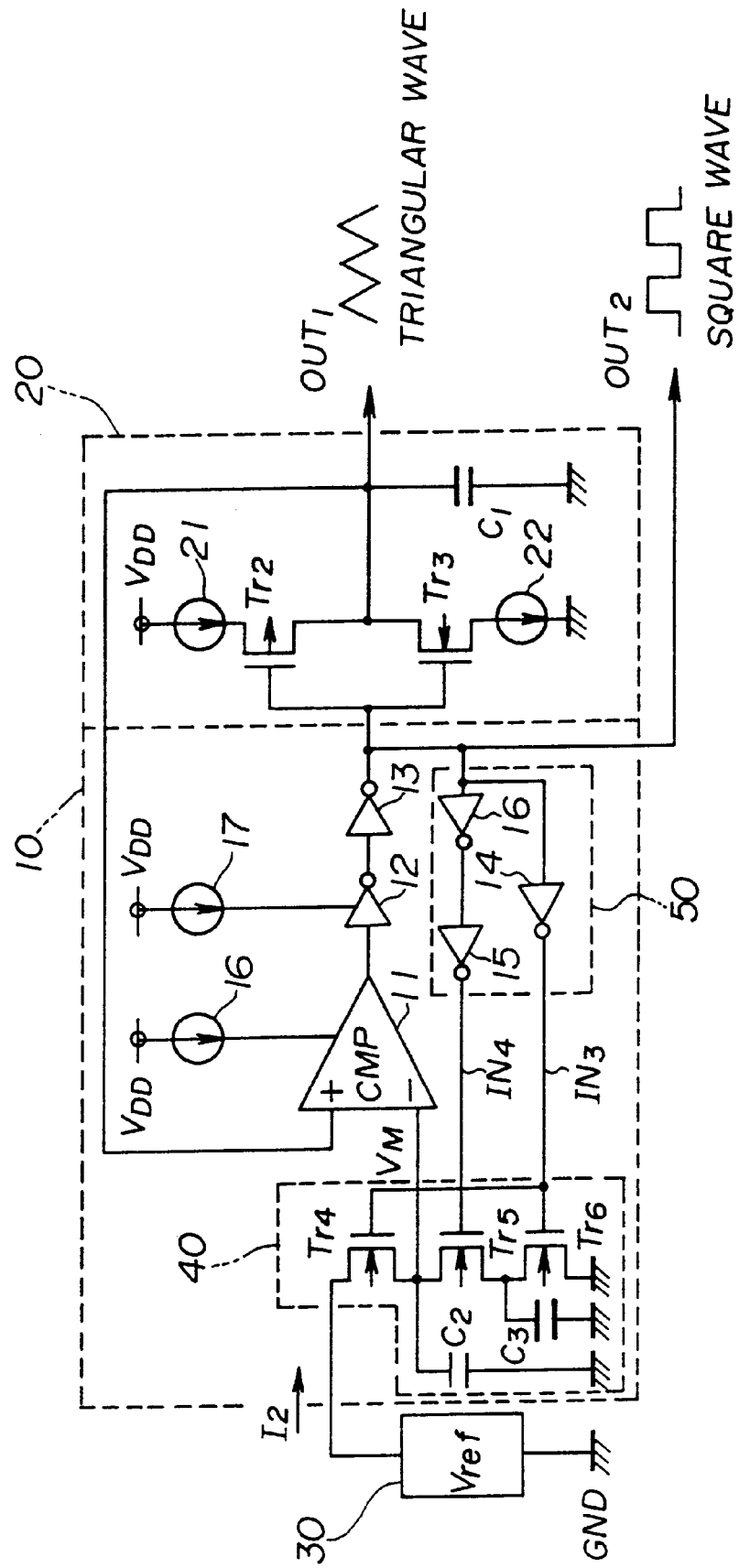
FIG. 2 is a circuit diagram of a waveform generating circuit comprising a hysteresis comparator circuit according to a first embodiment of the present invention.

A description will now be given of a first embodiment of the present invention. FIG. 2 is a circuit diagram of a waveform generating circuit 100 comprising a hysteresis comparator circuit 10 according to the first embodiment of the present invention. FIG. 3 is a timing chart of the waveform generating circuit 100 shown in FIG. 2.

The waveform generating circuit shown in FIG. 2 comprises the hysteresis comparator circuit 10, a constant current charging and discharging circuit 20 and a reference voltage source 30. These circuits are formed by n-channel MOS transistors, p-channel MOS transistors, resistive elements and capacitors formed on a silicon semiconductor substrate so as to be formed into an integrated circuit device.

The reference voltage source 30 can be a conventional constant-voltage circuit comprising, for example, saturation-connected n-channel MOS transistors. The reference voltage source 30 provides a reference voltage $V_{ref}$.

The hysteresis comparator circuit 10 comprises a hysteresis voltage generating circuit 40, a switch drive circuit 50, a hysteresis comparator (CMP) 11, constant current sources 16 and 17 and inverters 12 and 13.

The hysteresis comparator (CMP) 11 has a minus input terminal and a plus input terminal. An input threshold voltage $V_M$ is input to the minus input terminal of the hysteresis comparator (CMP) 11. The input threshold voltage $V_M$ is changed between a first voltage value and a second voltage value. The first voltage value is used for changing an output of the hysteresis comparator (CMP) 11 from a low level to a high level. The second voltage value is used for changing the output of the hysteresis comparator (CMP) 11 from the high level to the low level. The output of the hysteresis comparator (CMP) 11 is provided to the constant current charging and discharging circuit 20 via the inverters 12 and 13.

The constant current charging and discharging circuit 20 comprises a p-channel MOSFET $Tr_2$, an n-channel MOSFET $Tr_3$, constant current generating circuits 21 and 22 and a charging and discharging capacitor $C_1$. The constant current generating circuit 21 controls a current flowing through the MOSFET $Tr_2$. The constant current generating circuit 22 controls a current flowing through the MOSFET $Tr_3$. A gate of each of the MOSFETs $Tr_2$ and $Tr_3$ is connected to an output terminal of the inverter 13 of the hysteresis comparator circuit 10. The MOSFETs $Tr_2$ and $Tr_3$ are connected between a power source potential $V_{DD}$ and a ground potential GND by a cascode coupling so that a triangular wave signal $OUT_1$ is output from drain terminals of the MOSFETs $Tr_2$ and $Tr_3$ via the charging and discharging capacitor $C_1$. Thus, the constant current charging and discharging circuit 20 outputs the triangular wave signal corresponding to the output signal of the hysteresis comparator circuit 10.

The hysteresis voltage generating circuit 40 comprises n-channel MOS transistors $Tr_4$, $Tr_5$ and $Tr_6$ which correspond to first, second and third switching elements $SW_1$, $SW_2$ and $SW_3$, respectively. The hysteresis comparator circuit 10 also comprises a first capacitor $C_2$ and a second capacitor $C_3$. The transistors $Tr_4$, $Tr_5$ and $Tr_6$ are connected in series between the reference voltage source 30 and the ground potential GND. Each of the transistors $Tr_4$, $Tr_5$ and $Tr_6$ is turned on and off by a signal output from the switch drive circuit 50.

Figure 4A:
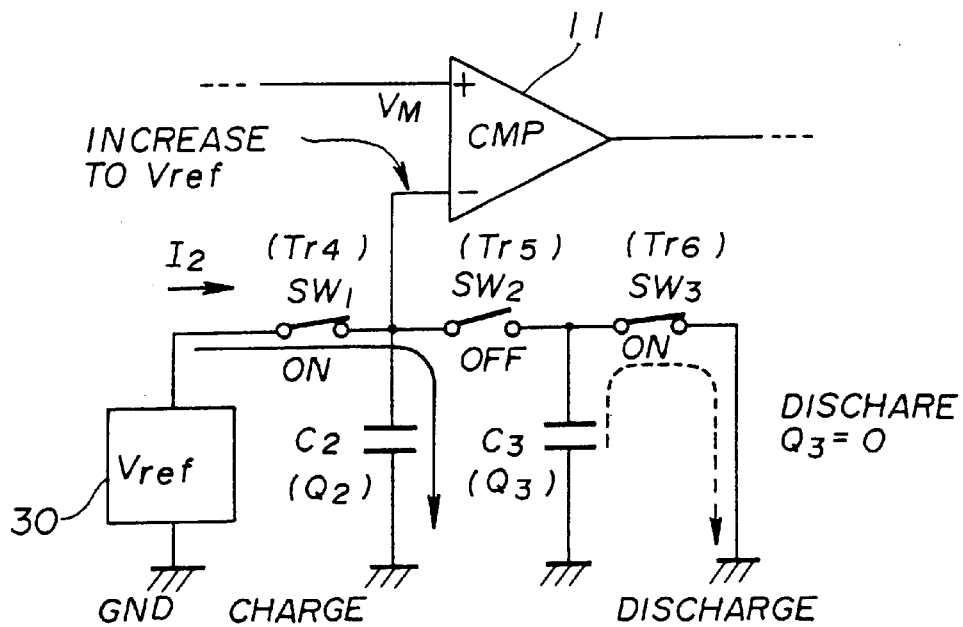
FIGS. 4A and 4B are illustrations for explaining an operation of the hysteresis comparator circuit shown in FIG. 2.
Figure 4B:
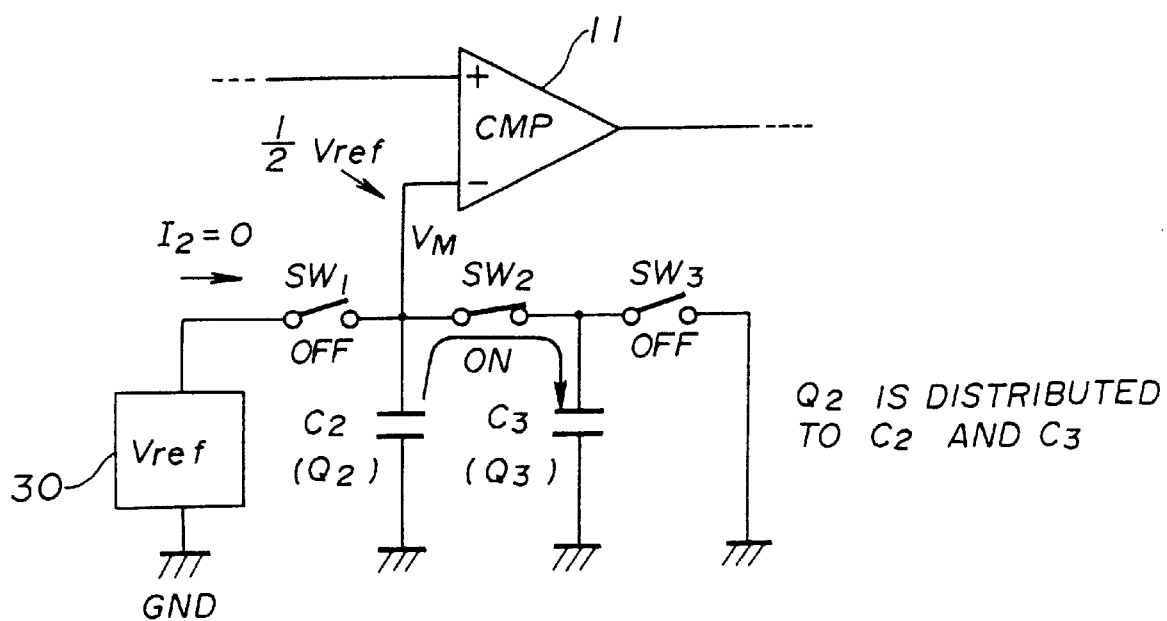

FIGS. 4A and 4B are illustrations for explaining an operation of the hysteresis comparator circuit 10. The first to third switching elements $SW_1$, $SW_2$ and $SW_3$ (transistors $Tr_4$, $Tr_5$ and $Tr_6$) are connected between the reference voltage source 30 ($V_{ref}$) and the ground potential GND by a cascode coupling. More specifically, a terminal of the first switching element $SW_1$ is connected to the reference voltage source 30, and the other terminal of the first switching element $SW_1$ is connected to a terminal of the second switching element $SW_2$. The terminal of the second switching element $SW_2$ connected to the other terminal of the switching element $SW_1$ is connected to the first capacitor $C_2$, and the other terminal of the second switching element $SW_2$ is connected to a terminal of the third switching element $SW_3$. The terminal of the third switching element $SW_3$ connected to the other terminal of the second switching element $SW_2$ is connected to the second capacitor $C_3$, and the other terminal of the third switching element $SW_3$ is connected to the ground potential GND.

A description will now be given, with reference to FIGS. 4A and 4B, of an operation of the hysteresis comparator circuit 10.

It is assumed that the switching element $SW_2$ is turned on and the switching elements $SW_1$ and $SW_3$ are turned off during a time period $t_1$, and the switching element $SW_2$ is turned off and the switching elements $SW_1$ and $SW_3$ are turned on during a time period $t_2$. As a result, the period t of the switching operation becomes $t_1+t_2$ ($t=t_1+t_2$). Additionally, it is assumed that the duty ratio between the time periods $t_1$ and $t_2$ is set to 50% ($t_1=t_2$).

FIG. 4A shows a state in which the switching element $SW_2$ is turned off (open) and the switching elements $SW_1$ and $SW_3$ are turned on (closed) during the time period $t_2$. As shown in FIG. 4A, when the first switching element $SW_1$ is closed, a current $I_2$ is supplied from the reference voltage source 30 to the first capacitor $C_2$. As a result, an electric charge $Q_2$ is stored in the capacitor $C_2$. Additionally, since the second switching element $SW_2$ is open and the third switching element $SW_3$ is closed, the second capacitor $C_3$ discharges an electric charge $Q_3$ to the ground. Accordingly, as shown in FIG. 3, the reference voltage $V_M$ input to the minus input terminal of the hysteresis comparator 11 is increased to the voltage $V_{ref}$ with a predetermined time constant.

FIG. 4B shows a state in which the switching element $SW_2$ is turned on (closed) and the switching elements $SW_1$ and $SW_3$ are turned off (open) during the time period $t_1$. As shown in FIG. 4B, when the first switching element $SW_1$ is opened, the current $I_2$ supplied from the reference voltage source 30 is cut off. As a result, a part of the electric charge $Q_2$ stored in the capacitor $C_2$ is transferred to the second capacitor $C_3$ via the second switching element $SW_2$. Accordingly, the electric charge $Q_2$ stored in the first capacitor $C_2$ is distributed between the first and second capacitors $C_2$ and $C_3$.

In the present embodiment, the capacitances of the first and second capacitors $C_2$ and $C_3$ are equal to each other. Accordingly, the electric charge $Q_2$ is evenly distributed between the first and second capacitors $C_2$ and $C_3$. As a result, the reference voltage $V_M$ input to the minus input terminal of the hysteresis comparator 11 is decreased to a half of the voltage $V_{ref}$ with a predetermined time constant.

Accordingly, the hysteresis comparator circuit 10 according to the present embodiment has a hysteresis characteristic in which the input threshold voltage (reference voltage $V_M$) is changed from the voltage $V_{ref}$ when the output voltage is changed from the low level to the high level to a half of the voltage $V_{ref}$ when the output voltage is changed from the high level to the low level.

In the present embodiment, the first, second and third switching elements $SW_1$, $SW_2$ and $SW_3$ correspond to the n-channel MOS transistors $Tr_4$, $Tr_5$ and $Tr_6$, respectively. Specifically, a drain of the transistor $Tr_4$ is connected to the reference voltage source 30, and a source of the transistor $Tr_4$ is connected to the first capacitor $C_2$ and the drain of the transistor $TR_5$. The drain of the transistor $Tr_5$ is connected to the first capacitor $C_2$, and the source of the transistor $Tr_4$, and a source of the transistor $Tr_5$ is connected to a drain of the transistor $Tr_6$ and the second capacitor $C_3$. The drain of the transistor $Tr_6$ is connected to the second capacitor $C_3$ and the source of the transistor $Tr_5$, and a source of the transistor $Tr_6$ is connected to the ground potential GND.

Accordingly, the first capacitor $C_2$ is connected between the ground potential GND and a junction between the source of the transistor $Tr_4$ and the drain of the transistor $Tr_5$. The reference voltage $V_M$ is provided via the junction between the source of the transistor $Tr_4$ and the drain of the transistor $Tr_5$. Additionally, the second capacitor $C_3$ is connected between the ground potential GND and a junction between the source of the transistor $Tr_5$ and the drain of the transistor $Tr_6$.

In the hysteresis voltage generating circuit 40 according to the present embodiment, when the transistor $Tr_4$ is turned on, the current $I_2$ is supplied from the reference voltage source 30 to the first capacitor $C_2$. As a result, the electric charge $Q_2$ is stored in the capacitor $C_2$. Additionally, since the transistor $Tr_5$ is turned off and the transistor $Tr_6$ is turned on, the second capacitor $C_3$ discharges an electric charge $Q_3$ to the ground. Accordingly, the reference voltage $V_M$ input to the minus input terminal of the hysteresis comparator 11 is increased to the voltage $V_{ref}$ with a predetermined time constant, and the voltage $V_{ref}$ is maintained until the time $t_2$ has passed.

After the time $t_2$ has passed and when the transistor $Tr_4$ is turned off, the current $I_2$ supplied from the reference voltage source 30 is cut off. As a result, a part of the electric charge $Q_2$ stored in the capacitor $C_2$ is transferred to the second capacitor $C_3$ via the transistor $Tr_5$ which is turned on after the time $t_2$ has passed. Accordingly, the electric charge $Q_2$ stored in the first capacitor $C_2$ is distributed between the first and second capacitors $C_2$ and $C_3$.

The reference voltage $V_M$ is represented by the following equation.

$$V_M = V_{ref} \times C_2/(C_2+C_3)$$

The current $I_2$ consumed by charging and discharging of the capacitors $C_2$ and $C_3$ flows during the time $t_1$, and the current $I_2$ does not flow during the time $t_2$. Accordingly, the current $I_2$ can be represented by the following equation.

$$I_2 = (C_2 \times dV_1/dt + C_3 \times dV_2/dt) \times (t_1/t)$$

Where $V_1$ is a voltage across the first capacitor $C_2$ when it is charged; $V_2$ is a voltage across the second capacitor $C_3$ when it is charged; and d/dt is a differential operator with respect to time.

If the duty ratio is set to 50% as mentioned above, $t_1/t$ becomes 0.5 ($t_1/t$ =0.5). Accordingly, if the switching frequency is set to 100 kHz, each of $t_1$ and $t_2$ is 5 µs. Additionally, if the reference voltage $V_{ref}$ is set to 0.9 V and the capacitance of each of the capacitors $C_2$ and $C_3$ is set to 5 pF, each of $V_1$ and $V_2$ is 0.45 V. Thus, the current $I_2$ is 0.45 µA.

On the other hand, in the conventional circuit, if the reference voltage $V_{ref}$ is set to 1.8 V (hysteresis voltage is 0.9 V); $R_1$ is set to 300 kΩ; $R_2$ is set to 100 kΩ; $R_3$ is set to 200 kΩ; and the duty ratio is set to 50%, the current $I_2$ flowing from the reference voltage source 30 is 3.75 µA. Accordingly, it can be appreciated that the current $I_2$ flowing in the hysteresis comparator circuit 10 according to the present embodiment is smaller than that of the conventional circuit. Thus, an efficiency of the DC/DC converter when it is operated with a small load can be improved.

As mentioned above, since the capacitances of the first and second capacitors $C_2$ and $C_3$ are equal to each other, the electric charge $Q_2$ is evenly distributed between the first and second capacitors $C_2$ and $C_3$. As a result, the reference voltage $V_M$ input to the minus input terminal of the hysteresis comparator 11 is decreased to a half of the voltage $V_{ref}$ with a predetermined time constant.

Accordingly, the hysteresis comparator circuit 10 according to the present embodiment has a hysteresis characteristic in which the input threshold voltage (reference voltage $V_M$) is changed from the voltage $V_{ref}$ when the output voltage is changed from the low level to the high level to a half of the voltage $V_{ref}$ when the output voltage is changed from the high level to the low level.

The switch drive circuit 50 comprises a first switching circuit 14, a second switching circuit 15 and an inverter 16. An output of the inverter 16 is supplied to an input of the second switching element 15. The first switching circuit 14 receives the output signal of the inverter 13, and outputs a first switching signal $IN_3$ to each of the transistors $Tr_4$ and $Tr_6$ so as to turn the transistors $Tr_4$ and $Tr_6$ on and off. The inverter 16 receives the output signal of the inverter 13, and inverts the output signal of the inverter 13. The inverted output signal is supplied to the second switching circuit 15. The second switching circuit 15 receives the output signal of the inverter 16, and generates a second switching signal $IN_4$. The second switching circuit 15 supplies the second switching signal $IN_4$ to the transistor $Tr_5$ so as to turn the transistor $Tr_5$ on and off.

Figure 5:
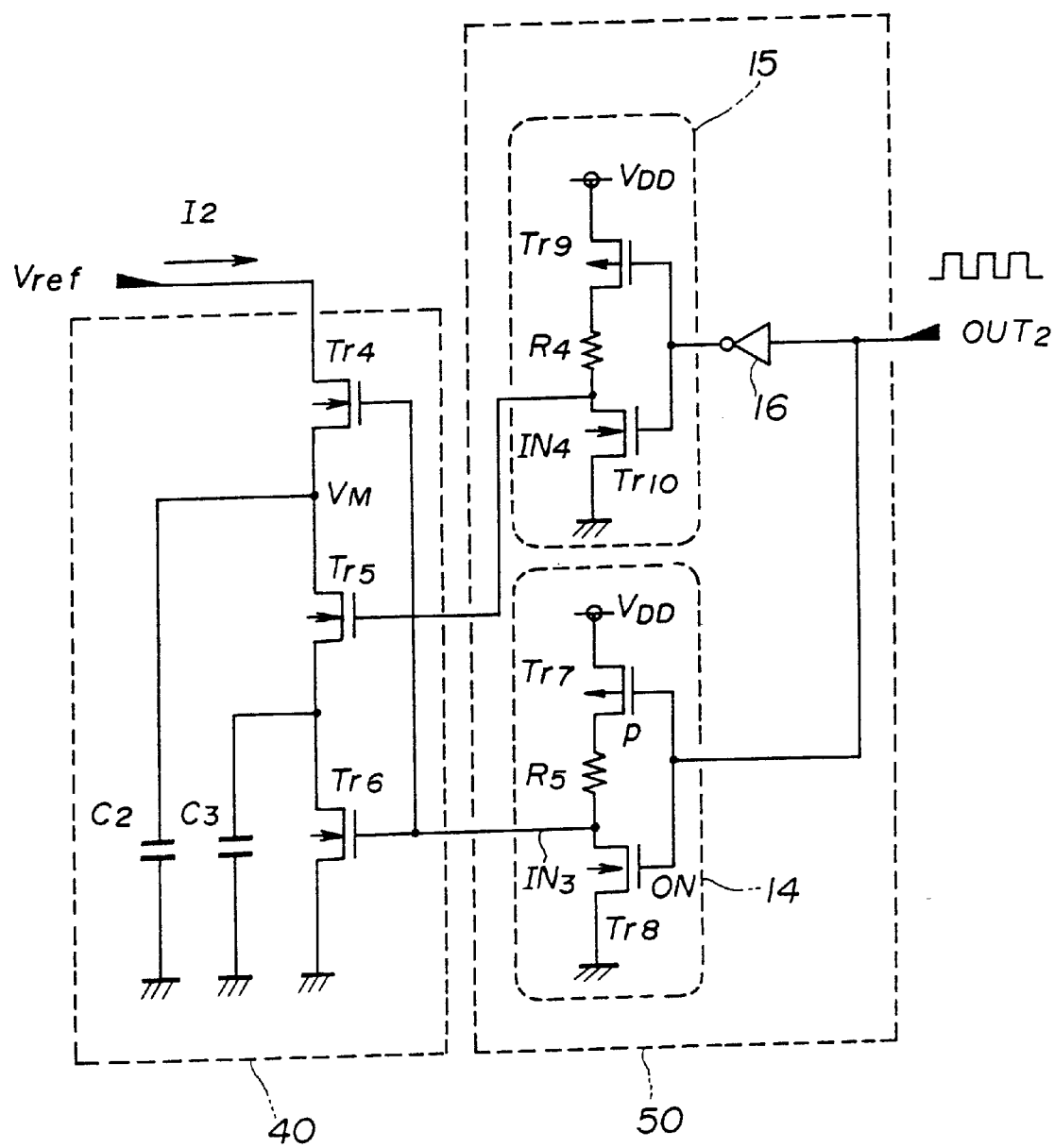
FIG. 5 is a circuit diagram of a switch drive circuit provided in the hysteresis comparator circuit shown in FIG. 2.

FIG. 5 is a circuit diagram of the switch drive circuit 50 provided in the hysteresis comparator circuit 10 shown in FIG. 2.

As shown in FIG. 5, the first switching circuit 14 comprises a p-channel MOS transistor $Tr_7$, an n-channel transistor $Tr_8$ and a resistor $R_5$. A drain of the transistor $Tr_7$ is connected to a drain of the transistor $Tr_8$ via the resistor $R_5$. A gate of the transistor $Tr_7$ is connected to a gate of the transistor $Tr_8$, and the gate of each of the transistors $Tr_7$ and $Tr_8$ is connected to the input of the inverter 16. A source of the transistor $Tr_7$ is connected to the voltage source $V_{DD}$. A source of the transistor $Tr_8$ is connected to the ground potential GND. The drain of the transistor $Tr_8$ is connected to the gate of each of the transistors $Tr_4$ and $Tr_6$ of the hysteresis voltage generating circuit 40.

Similarly, the second switching circuit 15 comprises a p-channel MOS transistor $Tr_9$, an n-channel transistor $Tr_{10}$ and a resistor $R_4$. A drain of the transistor $Tr_9$ is connected to a drain of the transistor $Tr_{10}$ via the resistor $R_4$. A gate of the transistor $Tr_9$ is connected to a gate of the transistor $Tr_{10}$, and the gate of each of the transistors $Tr_9$ and $Tr_{10}$ is connected to the output of the inverter 16. A source of the transistor $Tr_9$ is connected to the voltage source $V_{DD}$. A source of the transistor $Tr_{10}$ is connected to the ground potential GND. The drain of the transistor $Tr_{10}$ is connected to the gate of the transistor $Tr_5$ of the hysteresis voltage generating circuit 40.

In the above-mentioned switch drive circuit 50, when the square wave signal $OUT_2$ is changed to a high level (a start time of the time $t_1$ shown in FIG. 3), the transistor $Tr_8$ of the first switching circuit 14 is turned on and the transistor $Tr_7$ is turned off. Accordingly, the drain of the transistor $Tr_8$ is instantaneously changed to a low level. As a result, the transistors $Tr_4$ and $Tr_6$ of the hysteresis voltage generating circuit 40 are instantaneously turned off. Additionally, when the square wave signal $OUT_2$ is changed to the high level (a start time of the time $t_1$ shown in FIG. 3), the transistor $Tr_{10}$ of the second switching circuit 15 is turned off and the transistor $Tr_9$ is turned on. In this case, the resistor $R_4$ provides a predetermined time constant to the change of the second switching signal $IN_4$. Accordingly, the transistor $Tr_5$ of the hysteresis voltage generating circuit 40 is turned on according to the time constant provided by the resistive element $R_4$ (a rising of the second switching signal $IN_4$ shown in FIG. 3). Accordingly, in the present embodiment, the transistors $Tr_4$, $Tr_5$ and $Tr_6$ are not turned on at the same time. That is, the transistor $Tr_5$ is turned on a predetermined time after the transistors $Tr_4$ and $Tr_6$ are turned off.

On the other hand, when the square wave signal $OUT_2$ is changed to the low level (a start time of the time $t_2$ shown in FIG. 3), the transistor $Tr_8$ of the first switching circuit 14 is turned off and the transistor $Tr_7$ is turned on. In this case, the resistor $R_5$ provides a predetermined time constant to the change of state of the first switching signal $IN_3$. Accordingly, the transistors $Tr_4$ and $Tr_6$ of the hysteresis voltage generating circuit 40 are turned on according to the time constant provided by the resistor $R_5$ (a rising of the first switching signal $IN_3$ shown in FIG. 3). Additionally, the transistor $Tr_{10}$ of the second switching circuit 15 is turned on and the transistor $Tr_9$ is turned off. Accordingly, the drain of the transistor $Tr_{10}$ is instantaneously changed to the low level. As a result, the transistor $Tr_5$ of the hysteresis voltage generating circuit 40 is instantaneously turned on. Accordingly, in the present embodiment, the transistors $Tr_4$, $Tr_5$ and $Tr_6$ are not turned on at the same time. That is, the transistors $Tr_4$ and $Tr_6$ are turned on a predetermined time after the transistor $Tr_5$ is turned off.

As mentioned above, according to the switch drive circuit 50 of the present embodiment, the transistors $Tr_4$, $Tr_5$ and $Tr_6$ of the hysteresis voltage generating circuit 40 are not turned on at the same time. As a result, the reference voltage provided to the comparator 11 is prevented from being undesirably dropped which condition may occur when the transistors $Tr_4$, $Tr_5$ and $Tr_6$ are turned on at the same time.

Figure 6:
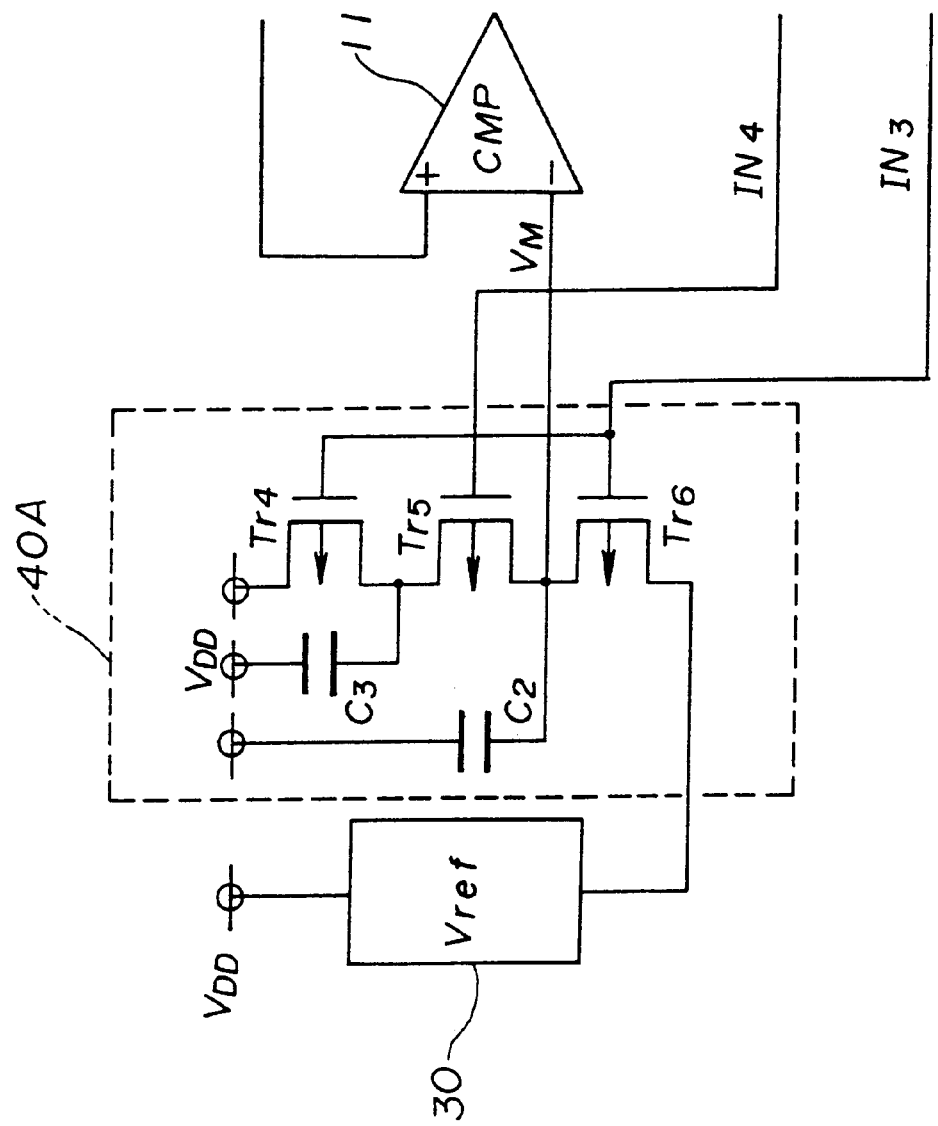
FIG. 6 is a circuit diagram of a variation of the hysteresis voltage generating circuit shown in FIG. 2.

FIG. 6 is a circuit diagram of a hysteresis voltage generating circuit 40A which is a variation of the hysteresis voltage generating circuit 40 shown in FIG. 2. In this variation, each of the transistors $Tr_4$, $Tr_5$ and $Tr_6$ is a p-channel MOS transistor. A source of the transistor $Tr_4$ is connected to the voltage source $V_{DD}$, and a drain of the transistor $Tr_4$ is connected to the second capacitor $C_3$ and a source of the transistor $Tr_5$. The second capacitor $C_3$ is connected between the voltage source $V_{DD}$ and a junction between the drain of the transistor $Tr_4$ and the source of the transistor $Tr_5$. A drain of the transistor $Tr_5$ is connected to the first capacitor $C_2$ and a source of the transistor $Tr_6$. The first capacitor $C_2$ is connected between the voltage source $V_{DD}$ and a junction between the drain of the transistor $Tr_5$ and the source of the transistor $Tr_6$. A drain of the transistor $Tr_6$ is connected to the reference voltage source $V_{ref}$.

In the above-mentioned circuit structure, the reference voltage $V_M$ is supplied to the hysteresis comparator 11 from the junction between the drain of the transistor $Tr_5$ and the source of the transistor $Tr_6$. Additionally, the first switching signal $IN_3$ is supplied to a gate of each of the transistors $Tr_4$ and $Tr_6$, and the second switching signal $IN_4$ is supplied to a gate of the transistor $Tr_5$.

As can be appreciated from FIG. 6, the hysteresis voltage generating circuit 40A has a reversed polarity with respect to the hysteresis voltage generating circuit 40 shown in FIG. 2, and can provide the same effect as the hysteresis voltage generating circuit 40.

The present invention is not limited to the specifically disclosed embodiments, and variations and modifications may be made without departing from the scope of the present invention.

The present application is based on Japanese priority application No. 10-174768 filed on Jun. 22, 1998, the entire contents of which are hereby incorporated by reference.

What is claimed is:

1. A hysteresis comparator circuit adapted to be connected to a reference voltage source providing a reference voltage, said hysteresis comparator circuit comprising:
   a hysteresis comparator comparing an input voltage with one of a first threshold voltage and a second threshold voltage different from said first threshold voltage to generate an output signal; and a hysteresis voltage generating circuit coupled to said reference voltage source comprising a plurality of switched capacitor circuits so as to selectively generate one of said first threshold voltage and said second threshold voltage in response to said output signal by controlling a state of electric charge stored in each of said capacitors, the electric charge stored in said capacitors being provided from said reference voltage source.

2. The hysteresis comparator circuit as claimed in claim 1, further comprising a switch drive circuit providing switching signals to said switching elements so as to control an operation of each of said switching elements.

3. The hysteresis comparator circuit as claimed in claim 2, wherein said switch drive circuit generates the switching signals so that a timing of change of state of one of said switching elements is shifted from that of the rest of said switching elements.

4. The hysteresis comparator circuit as claimed in claim 3, wherein said switch drive circuit includes a delay circuit delaying a timing of rise of said one of the switching signals.

5. The hysteresis comparator circuit as claimed in claim 2, wherein:

each of said switched capacitor circuits comprising a first switching element, a second switching element, a third switching element, a first capacitor and a second capacitor so that said first to third switching elements are connected in series between said reference voltage source and a ground, said first capacitor being connected between the ground and a junction between said first switching element and said second switching element, and said second capacitor being connected between the ground and a junction between said second switching element and said third switching element; and said switch drive circuit comprises a first switching signal circuit generating a first switching signal and a second switching signal circuit generating a second switching signal wherein said first switching signal is provided to each of said first and third switching elements and said second switching signal is provided to said second switching element so that said second switching element is turned on and off at a timing different from a timing of said first and third switching elements being turned on and off.

6. The hysteresis comparator circuit as claimed in claim 5, wherein each of said first, second and third switching elements is an n-channel MOS transistor.

7. The hysteresis comparator circuit as claimed in claim 5, wherein each of said first and second switching signal circuits is a transmission circuit constituted by a pair of an n-channel MOS transistor and a p-channel MOS transistor.

8. The hysteresis comparator circuit as claimed in claim 2, wherein:

each of said switched capacitor circuits comprising a first switching element, a second switching element, a third switching element, a first capacitor and a second capacitor so that said first to third switching elements are connected in series between said reference voltage source and a voltage source, said first capacitor being connected between said voltage source and a junction between said first switching element and said second switching element, and said second capacitor being connected between said voltage source and a junction between said second switching element and said third switching element, and said switch drive circuit comprises a first switching signal circuit generating a first switching signal and a second switching signal circuit generating a second switching signal wherein said first switching signal is provided to each of said first and third switching elements and said second switching signal is provided to said second switching element so that said second switching element is turned on and off at a timing different from a timing of said first and third switching elements being turned on and off.

9. The hysteresis comparator circuit as claimed in claim 8, wherein each of said first, second and third switching elements is a p-channel MOS transistor.

10. The hysteresis comparator circuit as claimed in claim 8, wherein each of said first and second switching signal circuits is a transmission circuit constituted by a pair of an n-channel MOS transistor and a p-channel MOS transistor.

11. A waveform generating circuit for outputting a triangular wave signal, said waveform generating circuit comprising a hysteresis comparator circuit and a constant current charging and discharging circuit, wherein said hysteresis comparator circuit is adapted to be connected to a reference voltage source providing a reference voltage, and said hysteresis comparator circuit comprises:

hysteresis comparator comparing an input voltage with one of a first threshold voltage and a second threshold voltage different from said first threshold voltage to generate an output signal; and a hysteresis voltage generating circuit coupled to said reference voltage source comprising a plurality of switched capacitor circuits so as to selectively generate one of said first threshold voltage and said second threshold voltage in response to said output signal by controlling a state of electric charge stored in each of said capacitors, an electric charge stored in said capacitors being provided from said reference voltage source, wherein said constant current charging and discharging circuit receives the output signal of said hysteresis comparator circuit and outputs the triangular wave signal corresponding to the output signal of said hysteresis comparator circuit.

* * * * *